(12) United States Patent
Lee

(10) Patent No.: US 7,553,743 B2
(45) Date of Patent: Jun. 30, 2009

(54) WAFER BONDING METHOD OF SYSTEM IN PACKAGE

(75) Inventor: Min Hyung Lee, Cheongjoo-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/863,357

(22) Filed: Sep. 28, 2007

(65) Prior Publication Data

US 2008/0138961 A1 Jun. 12, 2008

(30) Foreign Application Priority Data

Dec. 11, 2006 (KR) .................. 10-2006-0125252

(51) Int. Cl.
 *H01L 21/30* (2006.01)
(52) U.S. Cl. .................. 438/455; 438/108; 438/109; 438/118; 438/459; 257/E21.584; 257/E21.585

(58) Field of Classification Search .................. None
See application file for complete search history.

(56) References Cited

U.S. PATENT DOCUMENTS

| 4,528,072 A * | 7/1985 | Kurosawa et al. ............. 29/830 |
| 6,294,467 B1 * | 9/2001 | Yokoyama et al. .......... 438/680 |
| 2003/0092224 A1 * | 5/2003 | Hwang et al. ............... 438/151 |

* cited by examiner

*Primary Examiner*—N Drew Richards
*Assistant Examiner*—Kyoung Lee
(74) *Attorney, Agent, or Firm*—Saliwanchik, Lloyd & Saliwanchik

(57) ABSTRACT

A method of bonding a wafer in a system in package is provided. A plating layer is formed on each of a first semiconductor substrate and a second semiconductor substrate. The plating layers are then bonded to each other to connect the semiconductor substrates.

13 Claims, 2 Drawing Sheets

WAFER BONDING METHOD OF SYSTEM IN PACKAGE

CROSS-REFERENCE TO RELATED APPLICATION

The present application claims the benefit under 35 U.S.C. §119 of Korean Patent Application No. 10-2006-0125252, filed Dec. 11, 2006, which is hereby incorporated by reference in its entirety.

BACKGROUND

When fabricating semiconductor devices, devices can be stacked in a chip or a wafer and connected through a via. This method is commonly referred to as a system in package (SiP).

The SiP technique generally stacks various chips vertically in order to minimize the size of a semiconductor device.

An important aspect of the SiP is the forming of the via and the wafer bonding technique for interconnecting between the chips.

In a semiconductor SiP, in order to directly connect a chip to a substrate, a flip chip bonding method is typically used. The flip chip bonding method is a method that involves forming a bump on a chip pad and directly bonding the bump to the substrate of another chip.

A bump is an external connecting terminal, typically of a size in the range of 10 µm to 100 µm, formed of a metal material, such as gold, on an aluminum pad of a wafer.

However, the process for forming a bump can be very complicated and can make the overall process time very long.

Thus, there exists a need in the art for an improved fabricating method of a SiP, and, more specifically an improved wafer bonding method.

BRIEF SUMMARY

Embodiments of the present invention provide a wafer bonding method of a system in package (SiP).

The wafer bonding method of a system in package according to an embodiment of the present invention can comprise: forming a via hole on each of a first semiconductor substrate and a second semiconductor substrate; forming an insulating layer, a barrier metal layer, and a seed layer on each via hole; forming a photoresist pattern on each semiconductor substrate; forming a plating layer on each via hole; bonding the plating layer of the first semiconductor substrate to the plating layer of the second semiconductor substrate; and exposing the via hole on the lower or back surface of the second semiconductor substrate.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
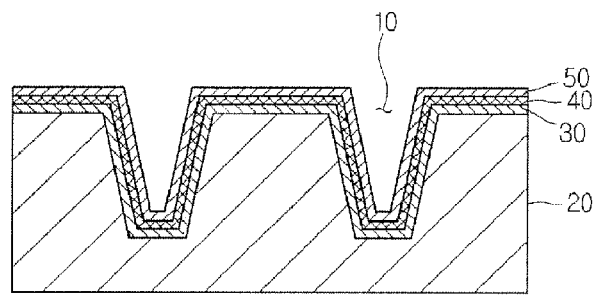
FIGS. 1 to 6 are cross-sectional views showing a wafer bonding process of a system in package according to an embodiment of the present invention.

Referring to FIG. 1, a via hole 10 can be formed on a first semiconductor substrate 20 by performing a damascene process. For example, the damascene process can be a single damascene process or a dual damascene process.

An insulating layer 30 can be formed on the first semiconductor substrate 20 provided with the via hole 10. The insulating layer 30 can be formed of any appropriate material known in the art, for example, $SiO_2$, SiN, SiON, or any combination thereof. The insulating layer 30 can be formed to a thickness of about 10 Å to about 5000 Å. Also, the insulating layer 30 can be formed by chemical vapor deposition (CVD), a thermal oxidation method, or any other appropriate method known in the art.

A barrier metal layer 40 can be formed on the insulating layer 30 to help inhibit diffusion of copper (Cu), which may be the buried material of the via hole 10. The barrier metal layer 40 can be formed of any appropriate material known in the art, for example, Ta, TaN, TiSiN, TaSiN, or any combination thereof. The barrier metal layer 40 can be formed to a thickness of about 10 Å to about 5000 Å using CVD, physical vapor deposition (PVD), atomic layer deposition (ALD), or any other appropriate method known in the art.

A seed layer 50 can be formed on the barrier metal layer 40. The seed layer 50 can be formed to a thickness of about 10 Å to about 5000 Å and can be any appropriate material known in the art, for example, Cu, gold (Au), platinum (Pt), or any combination thereof. The seed layer 50 can be formed using CVD, PVD, ALD, or any other appropriate method known in the art.

Figure 2:
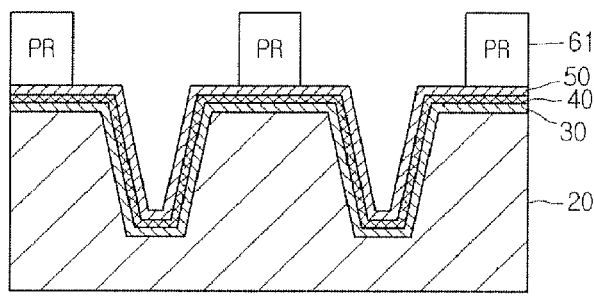

Referring to FIG. 2, a photoresist pattern 61 can be formed on the seed layer 50 by applying a photoresist layer and then exposing and developing it such that the via hole 10 is exposed. In an embodiment, the thickness of the photoresist pattern 61 can be about 1 µm to about 200 µm.

Also, in an embodiment, the shape of the photoresist pattern 61 can be the same as that of the via hole 10, and the photoresist pattern 61 can be formed such that the length of a side can be larger than the via hole 10 by about 1 µm to about 500 µm.

A bake process can be performed on the first semiconductor substrate 20 with the photoresist pattern 61. For example, the bake process can be performed at a temperature of about 100° C. to about 400° C. for a period of time of about 1 minute to about 100 minutes. The bake process can inhibit any reaction the photoresist pattern 61 may have with a plating solution that may be used during a subsequent plating process.

Figure 3:
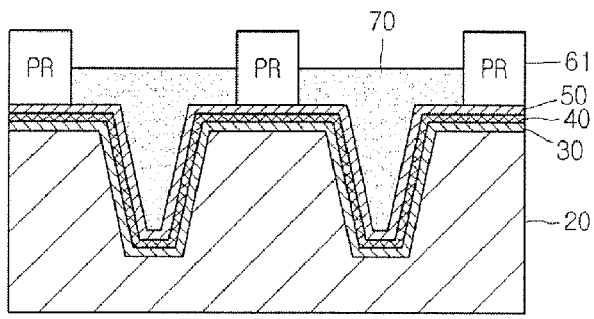

Referring to FIG. 3, a copper plating layer 70 can be formed on the first semiconductor substrate 20 by means of an electroplating method for a via gap-fill.

The electroplating method for forming the plating layer 70 can include dipping the wafer provided with the metal seed layer 50 in an electrolyzer and applying voltage to the wafer.

The electrolyzer can include an electrode and an electrolyte. In an embodiment, the electroplating of the metal can be performed such that the surface of the wafer is dipped in a solution in which the electroplating metal is dissolved, and the electrode and the surface of the wafer are electrically connected to an external power supplier. Then, if a copper ion or electrolyte moves to the surface of the wafer due to a provided current, the copper ion can be combined with an electron transferred to the surface of the wafer from a wire so that copper metal can be deposited.

The plating layer 70 can also be formed, while performing the gap-fill, by any other appropriate electroplating process known in the art, including a pulse reverse plating method.

Figure 4:
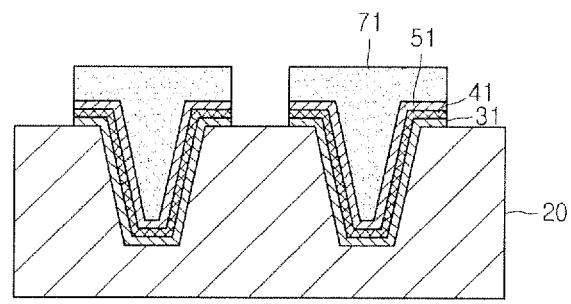

Then, referring to FIG. 4, a plating layer 71 can be formed by performing a planarization process, such as chemical mechanical polishing (CMP).

The planarization process of the plating layer 70 can be performed such that the surface of the plating layer 71 is lower than the upper surface of the photoresist pattern 61. In one embodiment, the plating layer 70 can be formed to have a thickness of about 1 µm to about 100 µm. This may be accomplished through a dishing phenomenon caused by the planarization 1 process.

Referring again to FIG. 4, the photoresist pattern 61 can be removed to fully expose the plating layer 71.

Next, the seed layer 50, the barrier metal layer 40, and the insulating layer 30 can be etched using the plating layer 71 as an etching mask.

Accordingly, the insulating layer 31, the barrier metal layer 41, the seed layer 51, and the plating layer 71 can be provided stacked on the via hole 10.

Furthermore, the plating layer 71 can be formed such that it is projected over the first semiconductor substrate 20.

Figure 5:
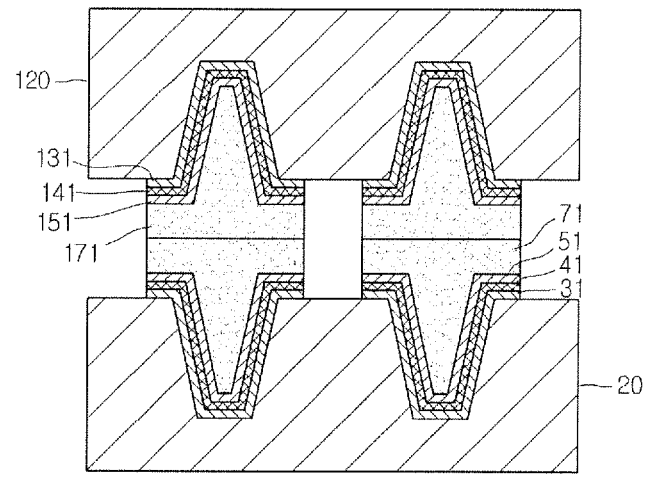

Referring to FIG. 5, a second semiconductor substrate 120 can be fabricated to be bonded with the first semiconductor substrate 20.

The second semiconductor substrate 120 can be formed according to the fabrication process of the first semiconductor substrate 20 described above, including forming a plating layer 171.

For example, an insulating layer 131, a barrier metal layer 141, a seed layer 151, and the plating layer 171 can be stacked inside the via hole 200 of the second semiconductor substrate 120.

After contacting the surface of the plating layer 71 of the first semiconductor substrate 20 to the surface of the plating layer 171 of the second semiconductor substrate 120, the first and second semiconductor substrates 20 and 120 can be bonded by applying heat and pressure.

For example, the bonding process of the first and second semiconductor substrates 20 and 120 can be performed at a pressure of about 1 psi to about 100 psi and at a temperature of about 200° C. to about 500° C. for a period of time of about 1 minute to about 100 minutes.

Accordingly, the respective plating layers 71 and 171 can be bonded such that the first semiconductor substrate 20 and the second semiconductor substrate 120 are connected to each other.

Figure 6:
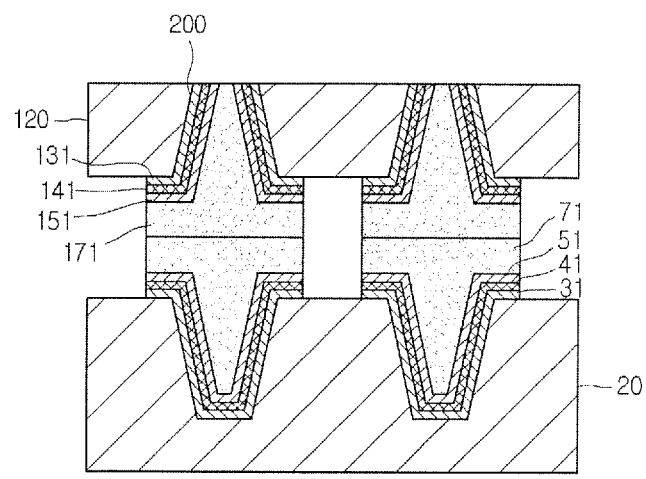

Referring to FIG. 6, in an embodiment, a wafer back grinding process can be performed on the lower or back surface of the second semiconductor substrate 120, which could be the upper surface of the bonded substrates.

A wafer back grinding process can chip a predetermined portion of the surface of the wafer by using a laser, an etching method, a mechanical grinding method, or any other appropriate method known in the art.

In embodiments in which a wafer back grinding process is performed, the via hole 200 of the second semiconductor substrate 120 can be exposed.

Therefore, the insulating layer 131, the barrier metal layer 141, the seed layer 151 and the plating layer 171 can be exposed through the via hole 200 of the second semiconductor substrate 120. In embodiments, the first and second semiconductor substrates 20 and 120 can include various structures and circuits.

The wafer bonding method of the system in package (SiP) according to embodiments of the present invention forms a plating layer on a semiconductor substrate higher than the surface of the substrate. The substrate can then be bonded to a plating layer of another semiconductor substrate formed in a similar shape. Therefore, the plating layer can serve as both a metal wiring and a bump. This simplifies and improves the efficiency of the fabricating process, thereby improving the productivity of the SiP.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with and embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of wafer bonding for a system in package, comprising:
   forming a first via hole on a first semiconductor substrate;
   forming a first photoresist pattern around the first via hole;
   forming a first plating layer on the first via hole, wherein an upper surface of the first plating layer is above an upper limit of the first via hole;
   forming a second via hole on a second semiconductor substrate;
   forming a second photoresist pattern around the second via hole;
   forming a second plating layer on the second via hole, wherein an upper surface of the second plating layer is above an upper limit of the second via hole;
   bonding the first plating layer to the second plating layer; and exposing the second via hole on a rear surface of the second semiconductor substrate,
   wherein the upper surface of the first plating layer is lower than an upper surface of the first photoresist pattern; and
   wherein the upper surface of the second plating layer is lower than an upper surface of the second photoresist pattern.

2. The method according to claim 1, wherein forming the first plating layer comprises:
   performing a first electroplating process, and
   performing a first planarization process using the first photoresist pattern as an endpoint; and
   wherein forming the second plating layer comprises:
   performing a second electroplating process, and
   performing a second planarization process using the second photoresist pattern as an endpoint.

3. The method according to claim 2, wherein the first planarization process is chemical mechanical polishing (CMP), and wherein the second planarization process is CMP.

4. The method according to claim 3, wherein performing the first planarization process comprises over-polishing the first plating layer such that the top surface of the first plating layer is lower than the upper surface of the first photoresist pattern; and wherein performing the second planarization process comprises over-polishing the second plating layer such that the top surface of the second plating layer is lower than the upper surface of the second photoresist pattern.

5. The method according to claim 1, wherein bonding the first plating layer to the second plating layer is performed at a pressure of about 1 psi to about 100 psi and at a temperature of about 200° C. to about 500° C. for a period of time of about 1 minute to about 100 minutes.

6. The method according to claim 1, wherein the first photoresist pattern has a thickness of about 1 μm to about 200 μm, and wherein the second photoresist pattern has a thickness of about 1 μm to about 200 μm.

7. The method according to claim 1, wherein the first plating layer has a thickness above the first via hole of about 1 μm to about 100 μm, and wherein the second plating layer has a thickness above the second via hole of about 1 μm to about 100 μm.

8. A method of wafer bonding for a system in package, comprising:
   forming a first via hole on a first semiconductor substrate;
   forming a first photoresist pattern around the first via hole;
   forming a first plating layer on the first via hole, wherein an upper surface of the first plating layer is above an upper limit of the first via hole;
   forming a second via hole on a second semiconductor substrate;
   forming a second photoresist pattern around the second via hole;
   forming a second plating layer on the second via hole, wherein an upper surface of the second plating layer is above an upper limit of the second via hole;
   bonding the first plating layer to the second plating layer; and exposing the second via hole on a rear surface of the second semiconductor substrate,
   forming a first insulating layer on the first via hole;
   forming a first barrier metal layer on the first insulating layer;
   forming a first seed layer on the first barrier metal layer, wherein the first plating layer is formed using the first seed layer and wherein the first photoresist pattern is formed on the first seed layer;
   forming a second insulating layer on the second via hole;
   forming a second barrier metal layer on the second insulating layer; and
   forming a second seed layer on the second barrier metal layer, wherein the second plating layer is formed using the second seed layer and wherein the second photoresist pattern is formed on the second seed layer.

9. The method according to claim 8, further comprising:
   removing the first photoresist pattern;
   etching the first insulating layer, the first barrier metal layer, and the first seed layer using the first plating layer as an etch mask;
   removing the second photoresist pattern; and
   etching the second insulating layer, the second barrier metal layer, and the second seed layer using the second plating layer as an etch mask.

10. The method according to claim 9, wherein removing the first photoresist pattern comprises performing a first ashing process; and wherein removing the second photoresist pattern comprises performing a second ashing process.

11. The method according to claim 1, further comprising:
    performing a bake process on the first photoresist pattern; and
    performing a bake process on the second photoresist pattern.

12. The method according to claim 11, wherein the bake process on the first photoresist pattern is performed at a temperature of about 100° C. to about 400° C. for a period of time of about 1 minute to about 100 minutes, and wherein the bake process on the second photoresist pattern is performed at a temperature of about 100° C. to about 400° C. for a period of time of about 1 minute to about 100 minutes.

13. A method of wafer bonding for a system in package, comprising:
    forming a first via hole on a first semiconductor substrate;
    forming a first photoresist pattern around the first via hole;
    forming a first plating layer on the first via hole, wherein an upper surface of the first plating layer is above an upper limit of the first via hole;
    forming a second via hole on a second semiconductor substrate;
    forming a second photoresist pattern around the second via hole;
    forming a second plating layer on the second via hole, wherein an upper surface of the second plating layer is above an upper limit of the second via hole;
    bonding the first plating layer to the second plating layer; and exposing the second via hole on a rear surface of the second semiconductor substrate,
    wherein exposing the second via hole on a rear surface of the second semiconductor substrate comprises performing a wafer back grinding process.

* * * * *